United States Patent
Baker

(10) Patent No.: US 6,914,838 B2
(45) Date of Patent: Jul. 5, 2005

(54) DUAL LOOP SENSING SCHEME FOR RESISTIVE MEMORY ELEMENTS

(75) Inventor: R. Jacob Baker, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/918,453

(22) Filed: Aug. 16, 2004

(65) Prior Publication Data

US 2005/0013184 A1 Jan. 20, 2005

Related U.S. Application Data

(62) Division of application No. 10/222,843, filed on Aug. 19, 2002, now Pat. No. 6,829,188.

(51) Int. Cl.[7] ................................................. G11C 7/00
(52) U.S. Cl. ........................................ 365/205; 365/158
(58) Field of Search ................................ 365/205, 158, 365/171, 173, 148, 189.01

(56) References Cited

U.S. PATENT DOCUMENTS 5,731,731 A * 3/1998 Wilcox et al. .............. 327/403
6,188,615 B1    2/2001 Perner et al.
6,317,375 B1 * 11/2001 Perner ........................ 365/206
6,504,750 B1    1/2003 Baker
6,577,525 B2    6/2003 Baker
6,693,826 B1    2/2004 Black et al.

* cited by examiner

Primary Examiner—Anh Phung
(74) Attorney, Agent, or Firm—Dickstein Shapiro Morin & Oshinsky LLP

(57) ABSTRACT

A method and apparatus for sensing a resistive state of a resistive memory element includes producing a first current related to a resistance of a memory cell. The first current is added to a second current during a first sensing time and subtracted from a third current during a second sensing time. The first, second and third currents are integrated over time using a capacitor, and a resulting voltage signal on the capacitor is timed using a clocked counter. A time average value of a digital output of the clocked counter is then related to the resistance of the memory cell, and hence to the resistive state of the resistive memory element.

28 Claims, 13 Drawing Sheets

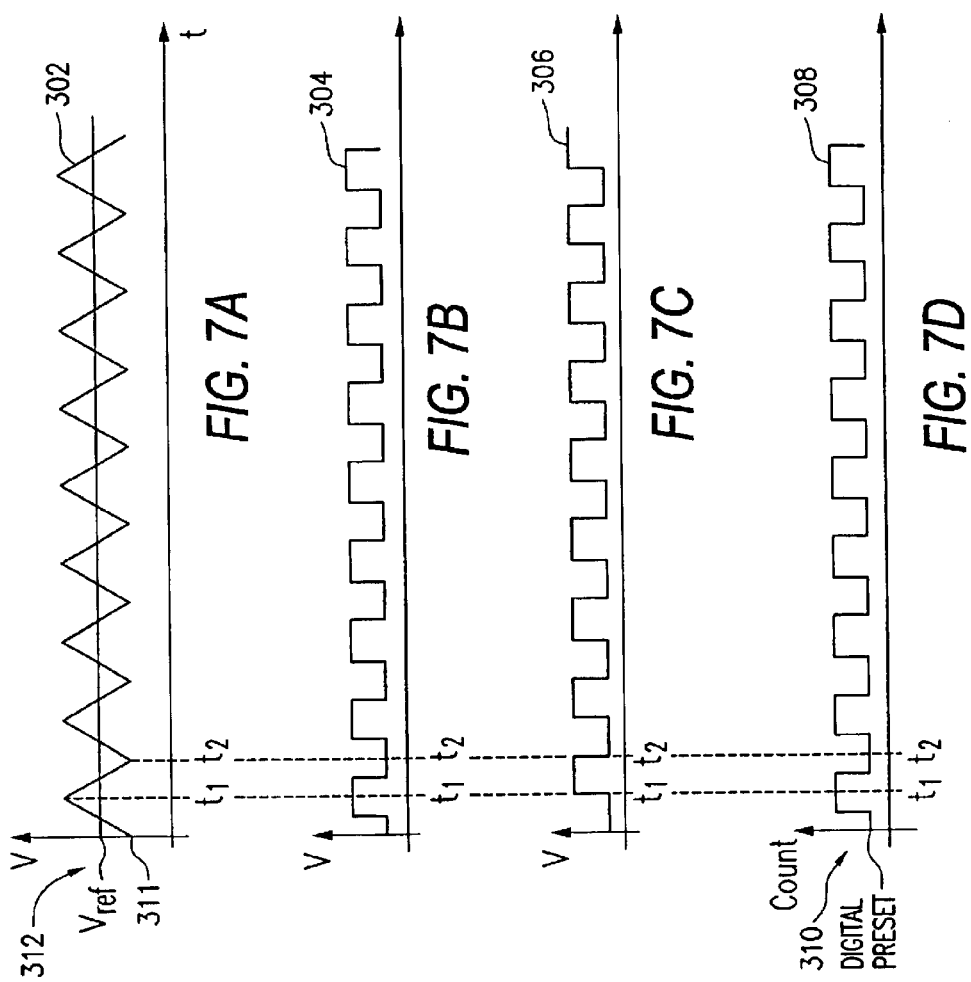

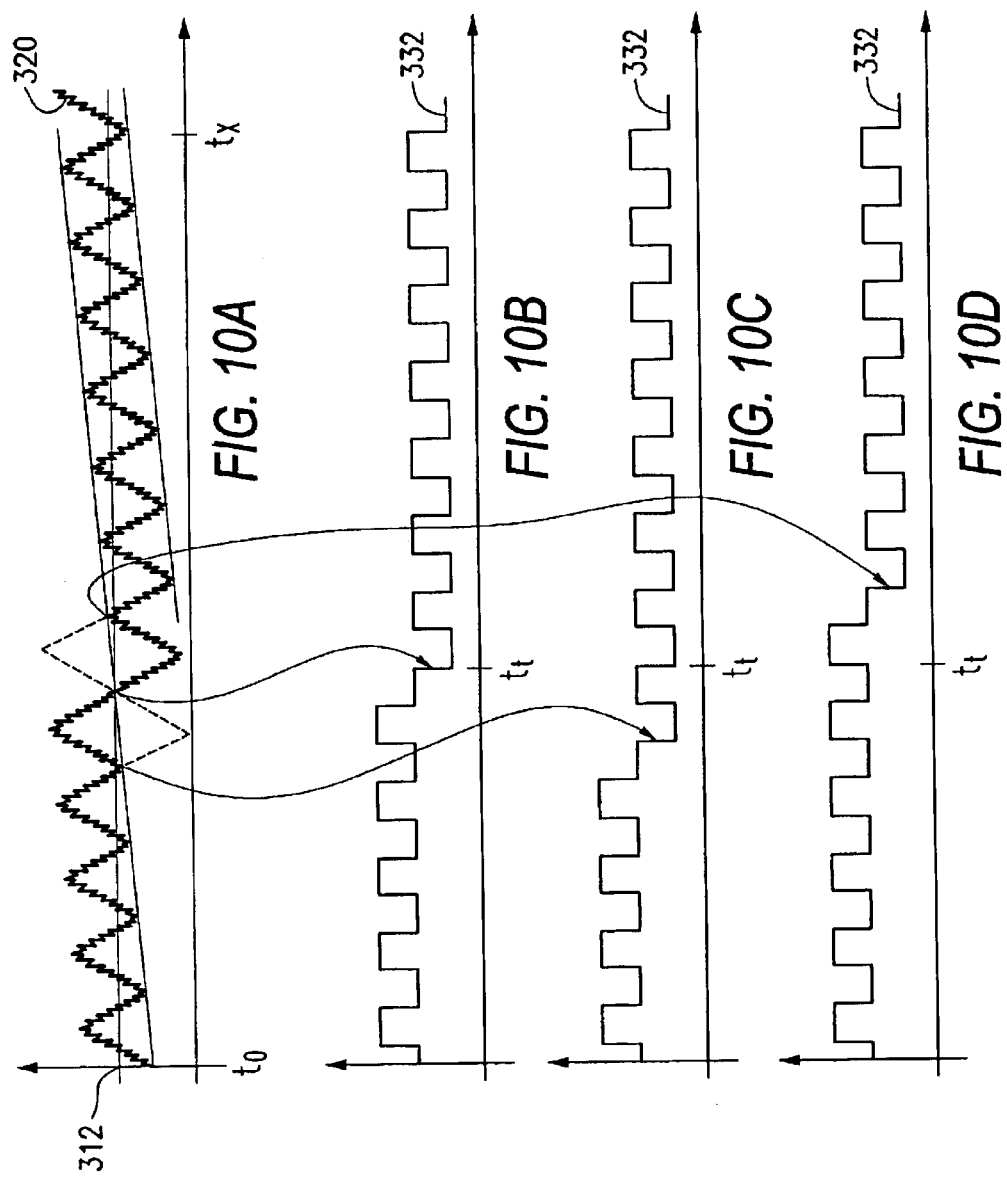

DUAL LOOP SENSING SCHEME FOR RESISTIVE MEMORY ELEMENTS

This application is a divisional of application Ser. No. 10/222,843, filed on Aug. 19, 2002 now U.S. Pat. No. 6,892,188 issued on Dec. 7, 2004, which is incorporated herein by reference.

BACKGROUND OF THE INVENTION

1. Field of the Invention

The present invention relates to the reading of resistor-based memory devices such as magneto-resistive random access memory (MRAM) devices which store logic values as resistive states in a memory cell.

2. Description of the Related Art

FIG. 1 shows one example of a resistor based memory array architecture called a crosspoint array. The memory array 8 includes a plurality of row lines 6 arranged orthogonally to a plurality of column lines 12. Each row line is coupled to each of the column lines by a respective resistive memory cell 14. The resistance value of each memory cell stores one of two or more logical values depending on which of a plurality of resistance values it is programmed to exhibit. A characteristic of the crosspoint array having resistance cells 14 connected to row and column lines is that there are no memory cell access transistors in the array.

An MRAM device is one approach to implementing a resistance based memory. In an MRAM, each resistive memory cell typically includes a pinned magnetic layer, a sensed magnetic layer and a tunnel barrier layer between the pinned and sensed layers. The pinned layer has a fixed magnetic alignment, and a magnetic alignment of the sensed layer can be programmed to different orientations. The resistance of the cell varies, depending on the alignment of the sensed layer. One resistance value, e.g., a higher value, is used to signify a logic "one" while another resistance value, e.g., a lower value, is used to signify a logic "zero". The stored data is read by sensing respective resistance values of the cells, and interpreting the resistance values thus sensed as logic states of the stored data.

For binary logic state sensing, the absolute magnitude of memory cell resistance need not be known; only whether the resistance is above or below a threshold value that is intermediate to the logic one and logic zero resistance values. Nonetheless sensing the logic state of an MRAM memory element is difficult because the technology of the MRAM device imposes multiple constraints.

An MRAM cell resistance is sensed at the column line of the addressed cell. In order to sense the cell, a row line connected to that cell is typically grounded while the remaining row lines and column lines are held at a particular voltage. Reducing or eliminating transistors from a memory cell tends to reduce cell real estate requirements, increasing storage density and reducing costs. A cell of a crosspoint array, as discussed above, includes no transistors. This is achieved by allowing each resistive element to remain electrically coupled to respective row and column lines at all times. As a result, when a memory cell is sensed it is also shunted by a significant sneak current path through the other memory cells of the addressed row line.

In a conventional MRAM device, the differential resistance between a logic one and a logic zero is typically about 50 KΩ, or 5% of scale. Accordingly, a sensing voltage across a sensed MRAM device varies by about 5% of scale between the logic one and logic zero states.

One approach to sensing MRAM resistance is to integrate a current corresponding to the sensing voltage over time, and to sample the resulting integrated voltage after a given time period. This can be done by applying a voltage to an input of a transconductance amplifier, and accumulating a current output by the amplifier with a capacitor.

FIG. 2 illustrates the theoretical change of voltage on such a capacitor with time. The time interval $t_m$ that the capacitor voltage takes to climb from an initial voltage $V_{init}$ to a reference voltage $V_{ref}$ is related to the voltage applied at the input of the transconductance amplifier.

As shown in FIG. 3, however, this sensing scheme is vulnerable to stochastic noise. A noise component on the integrated voltage can readily overcome the signal being measured. The resulting measurement produces an erroneous result when the noisy voltage signal crosses the reference voltage ($V_{ref}$) threshold at time $t_{err}$.

Accordingly, a robust and reliable sensing method is needed for sensing the state of a resistive memory element.

BRIEF SUMMARY OF THE INVENTION

According to one aspect of the present invention, MRAM cell logic state is sensed by configuring an memory cell so as to form a sensing voltage across the cell that is related to a resistance of the cell. The sensing voltage is applied to an input of a transconductance amplifier, which outputs a sensing current related to the sensing voltage. The sensing current is integrated over time with an additional current and filtered through a digital counter to improve sensing circuit sensitivity.

During sensing, the sensing circuit progresses through several states. In a first state the sensing current is summed with a first positive current to form a first summed current that charges a capacitor. In a second state, the sensing current is summed with a second negative current, to form a second summed current that discharges the capacitor. The resulting voltage signal on the capacitor is compared to a reference voltage. A result of the comparison is used to control a clocked digital counter. An output count of the digital counter depends, on a time-averaged basis, on the sensing voltage. By comparing the count value of the digital counter to a digital threshold value at a known time interval after the counter is preset to a preset value, the logical state of the sensed MRAM cell can be ascertained.

These and other features and advantages of the invention will be more clearly understood from the following detailed description which is provided in connection with the accompanying drawings.

BRIEF DESCRIPTION OF THE DRAWINGS

FIGS. 7A–7D shows a timing diagram for a voltage signal the of FIG. 6 circuit with null input and related values;

FIGS. 10A–10D shows a timing diagram for a voltage signal as in FIGS. 8A–8B, with an additional noise component;

DETAILED DESCRIPTION OF THE INVENTION

The present invention operates by receiving a signal, representing a programmed resistance state of a resistive memory cell, at a digital counter. A resulting digital count value, taken after a sensing time interval, represents the resistance state of the memory cell. Because the count value is digitized and acquired over an extended time, high-frequency stochastic noise in the system is filtered out.

Figure 1:
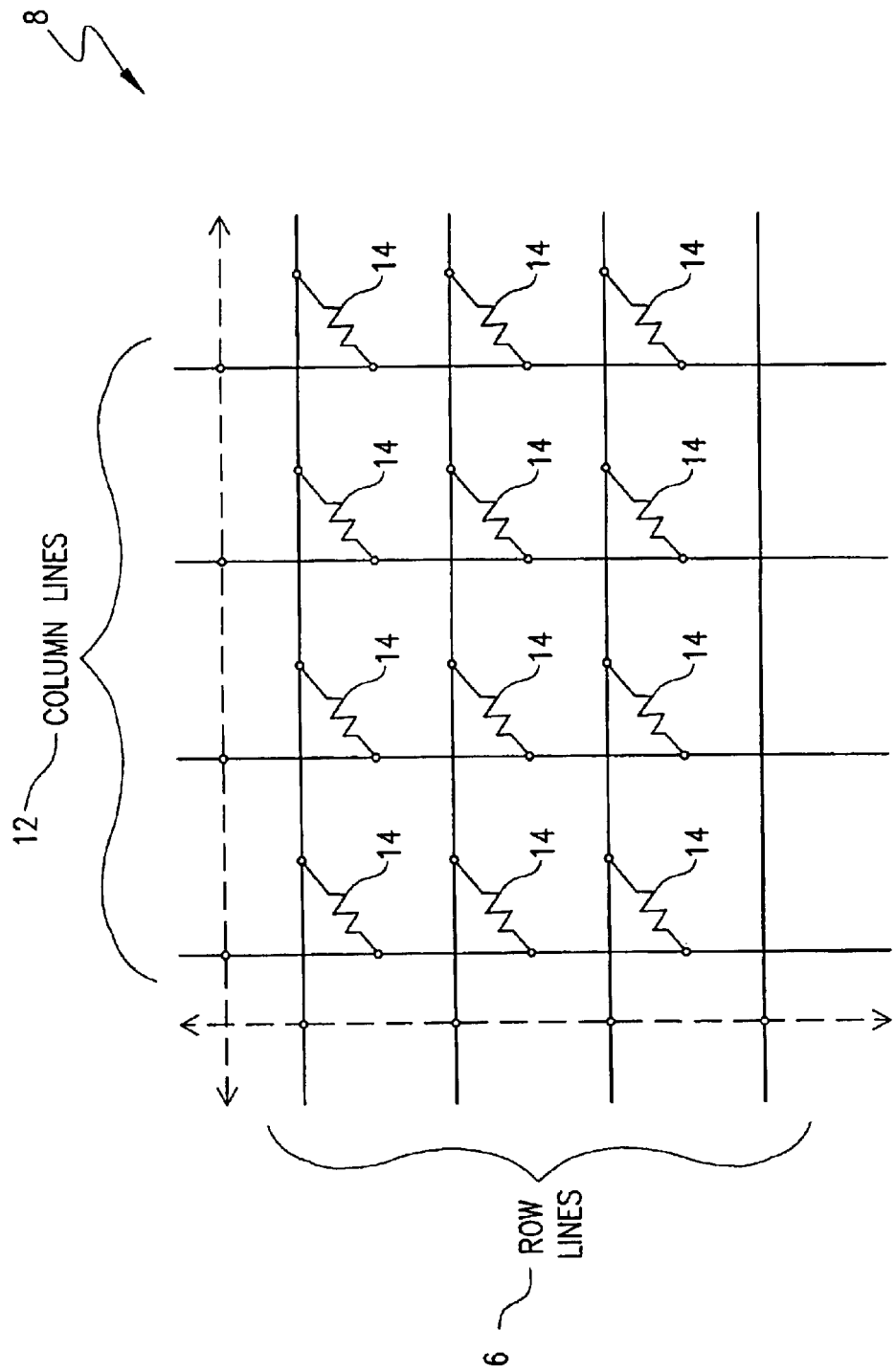
FIG. 1 shows a portion of conventional MRAM device using a crosspoint architecture.
Figure 2:
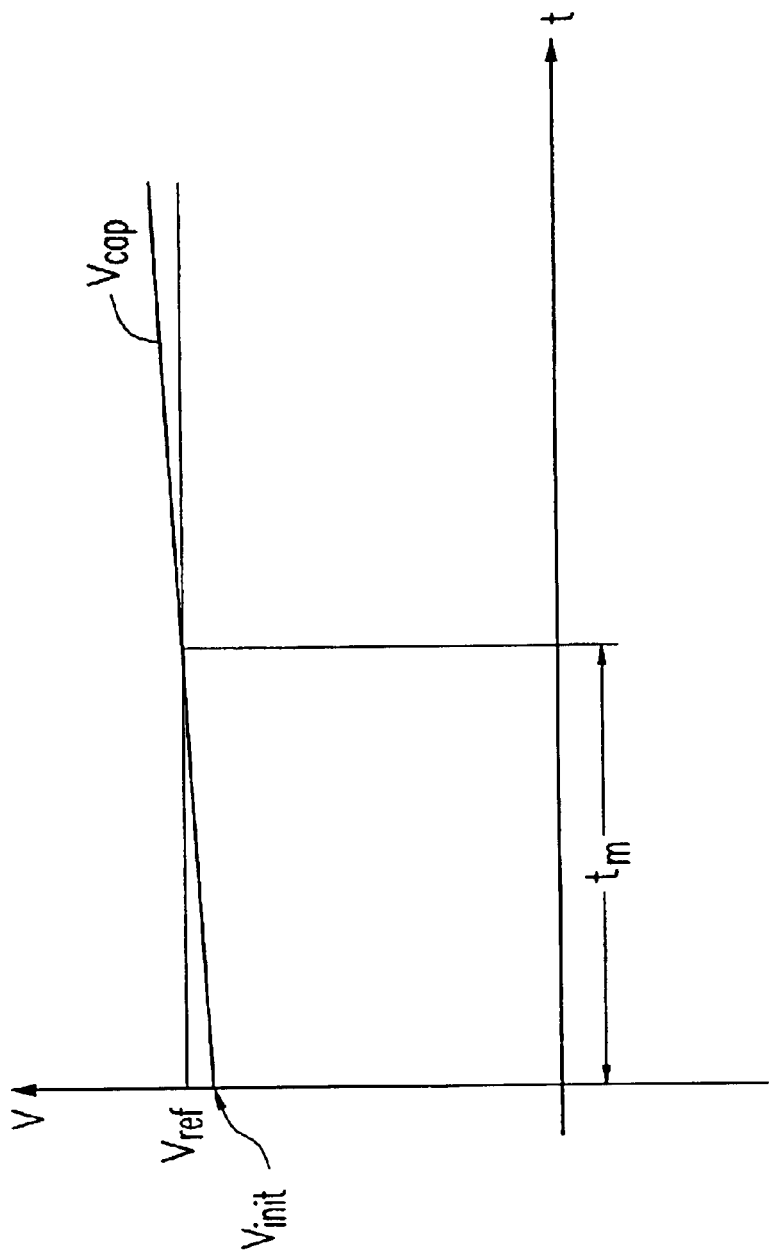
FIG. 2 shows an idealized time versus voltage plot of an integrated voltage according to one method of sensing MRAM cell resistance.
Figure 3:
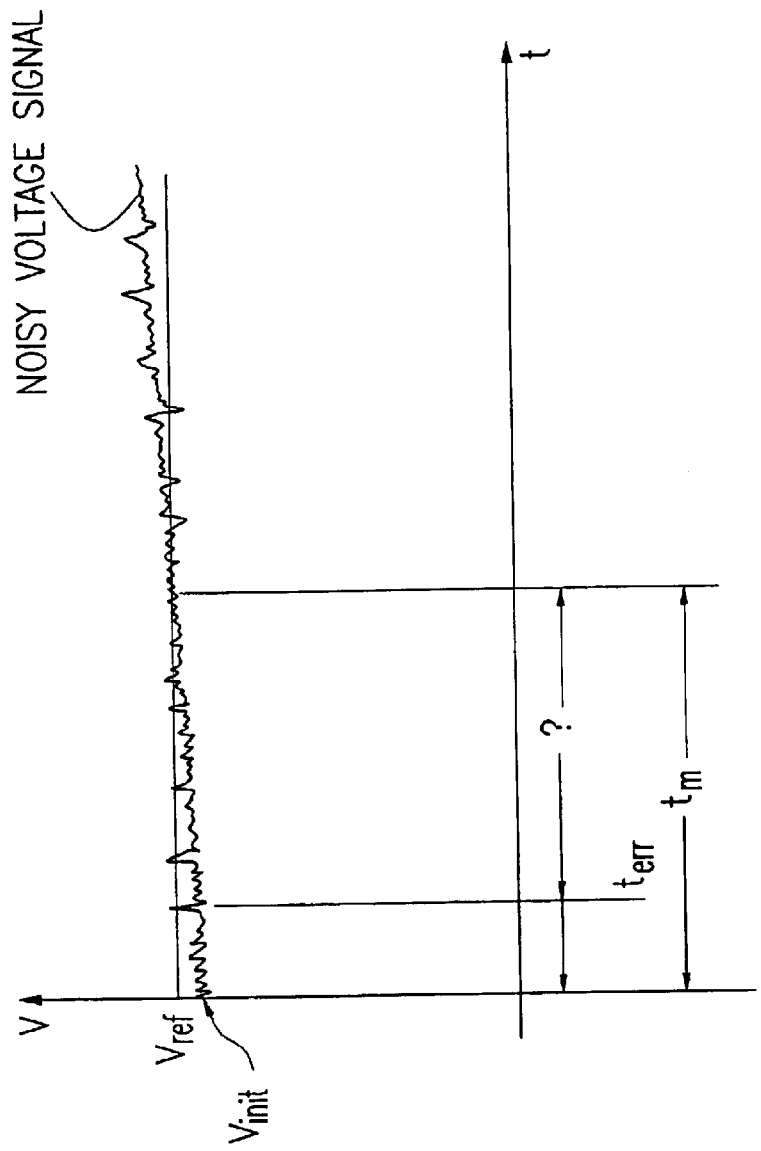
FIG. 3 shows a time versus voltage plot as in FIG. 2 with an additional voltage noise component.
Figure 4:
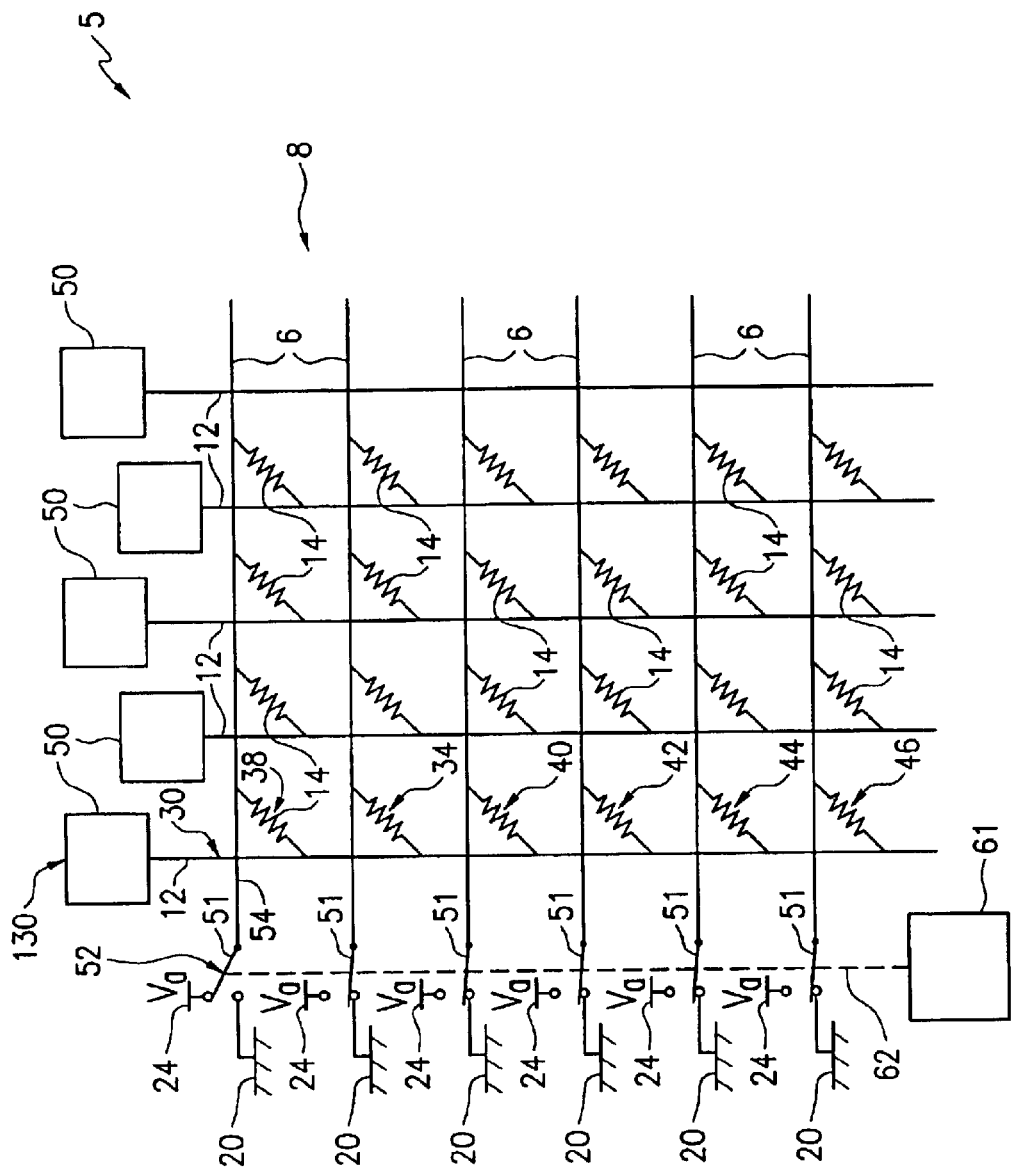
FIG. 4 shows a portion of a magnetic random access memory device according to the present invention.

FIG. 4 shows, in schematic overview, a portion of a memory device according to one aspect of the invention. A crosspoint array of resistive memory cells are configured so that resistance of a particular memory cell may be represented by a sensing voltage. The device 5 includes an array 8 of MRAM cells 14, a plurality of spaced electrically conductive row lines 6, and a plurality of spaced electrically conductive column lines 12. The plurality of row lines 6 is disposed substantially orthogonally to the plurality of column lines 12, defining a plurality of overlap regions at the respective crossings. In other embodiments, the row and column lines can be disposed in oblique spaced relation to one another. Each row line is connected to each of the plurality of column lines by a respective plurality of MRAM resistive cells 14. A plurality of switching devices 51, typically implemented with transistors, are each coupled to a respective one of the row lines 6, to a first source of constant potential (ground) 20, and a second source of constant potential (array voltage Va) 24. A control circuit 61 includes a row decoder, and is coupled, as illustrated by 62, to each of the plurality of switching devices 51. The switching devices 51 are adapted to alternately connect the row lines 6 to ground 20 and to a source of voltage, Va 24 under the control of control circuit 61. The control circuit 61 maintains each of the plurality of switching devices 51 in a default row line grounded condition. Switching device 52 illustrates the state of switching device 51 when row 54 is selected during a read cycle. A plurality of sensing circuits 50 are respectively connected to the plurality of column lines 12.

A power supply provides a source of electrical voltage that maintains the various electrical potentials at which the circuit operates. The power supply defines three potentials including a ground potential 20, an operating voltage Vcc for the circuit elements, and the voltage Va 24 connected as indicated above. In one aspect of the invention, the voltage Va 24 is approximately 5 volts.

Figure 5:
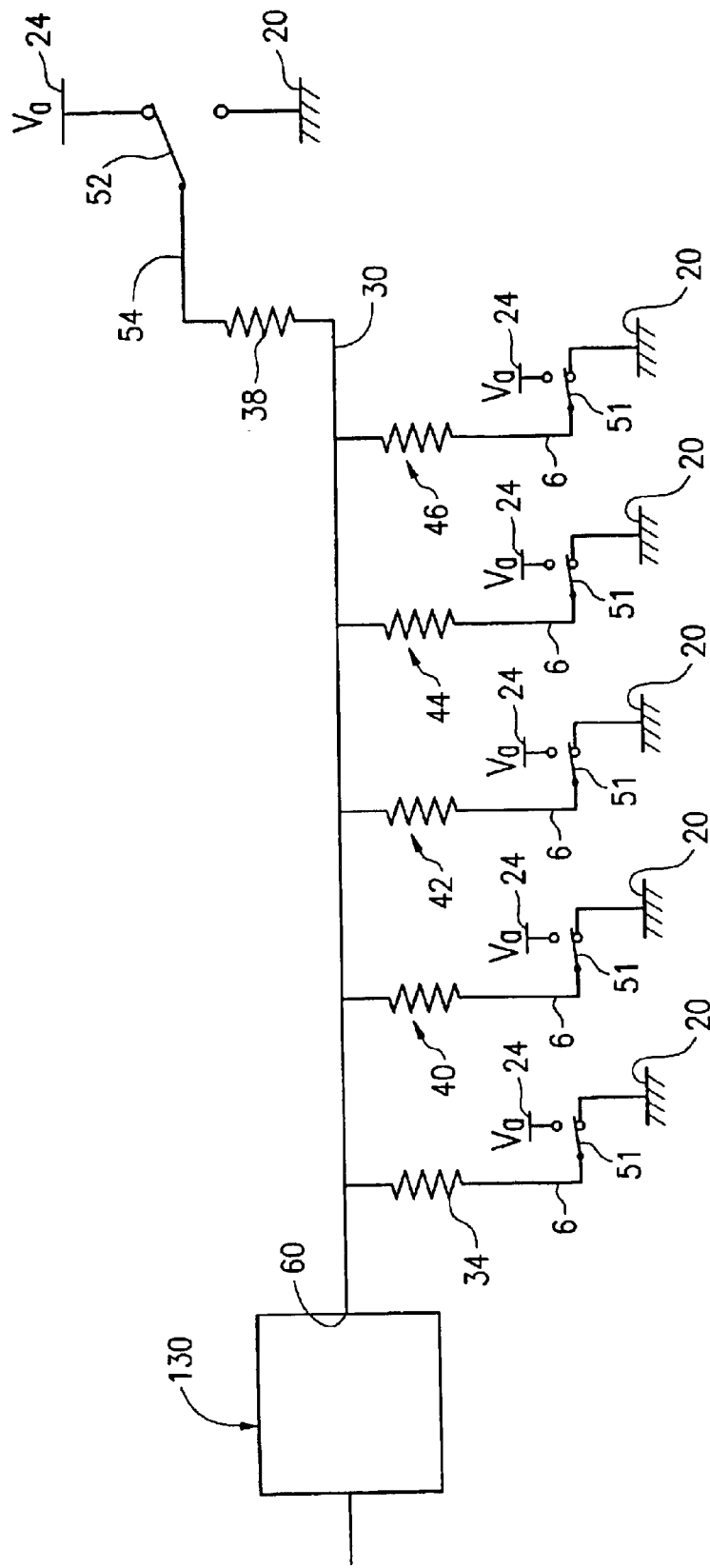
FIG. 5 shows a portion of the FIG. 4 device during cell sensing.

In FIG. 5, selected row line 54 is shown coupled to the voltage Va 24 by selected switching device 52. A particular addressed column line 30 of the plurality of column lines 12 is also shown. The particular memory cell 38 that connects the selected row line 54 and the particular column line 30 is also illustrated. A respective sensing circuit 130 is operatively connected to column line 30 for sensing the voltage of the column line 30 with respect to ground 20.

As illustrated, sneak path memory cells, e.g., 34, 40, 42, 44, 46, forming a subset of the plurality of memory cells 14, are connected between the column line 30 and a respective plurality of row lines 6. Each row line 6, except for the one connected to sensed cell 38, is grounded by a respective switching device 51. Thus a voltage divider is formed by the parallel combination of sneak path cells, e.g., 34, 40, 42, 44, 46 connected in series with the particular resistance cell 38 being sensed. Column line 30 defines a sensing node between the sneak path cells and the sensed cell 38. The sensing voltage at column line 30 is coupled to the sensing circuit 130.

In one embodiment, the resistance of selected resistive memory cell 38 ranges from about 900 KΩ to about 1.1 MΩ. In various embodiments prepared using current technology, memory cell resistance may be found in a range from about 900 KΩ to about 1 MΩ in the low resistance state and from about 950 KΩ to about 1.1 MΩ in the high resistance state. In a particular device, the low and high ranges do not overlap. It is understood that advances in the technology of the resistive cell may yield different resistance values to which the present invention may nonetheless be effectively applied.

Figure 6:
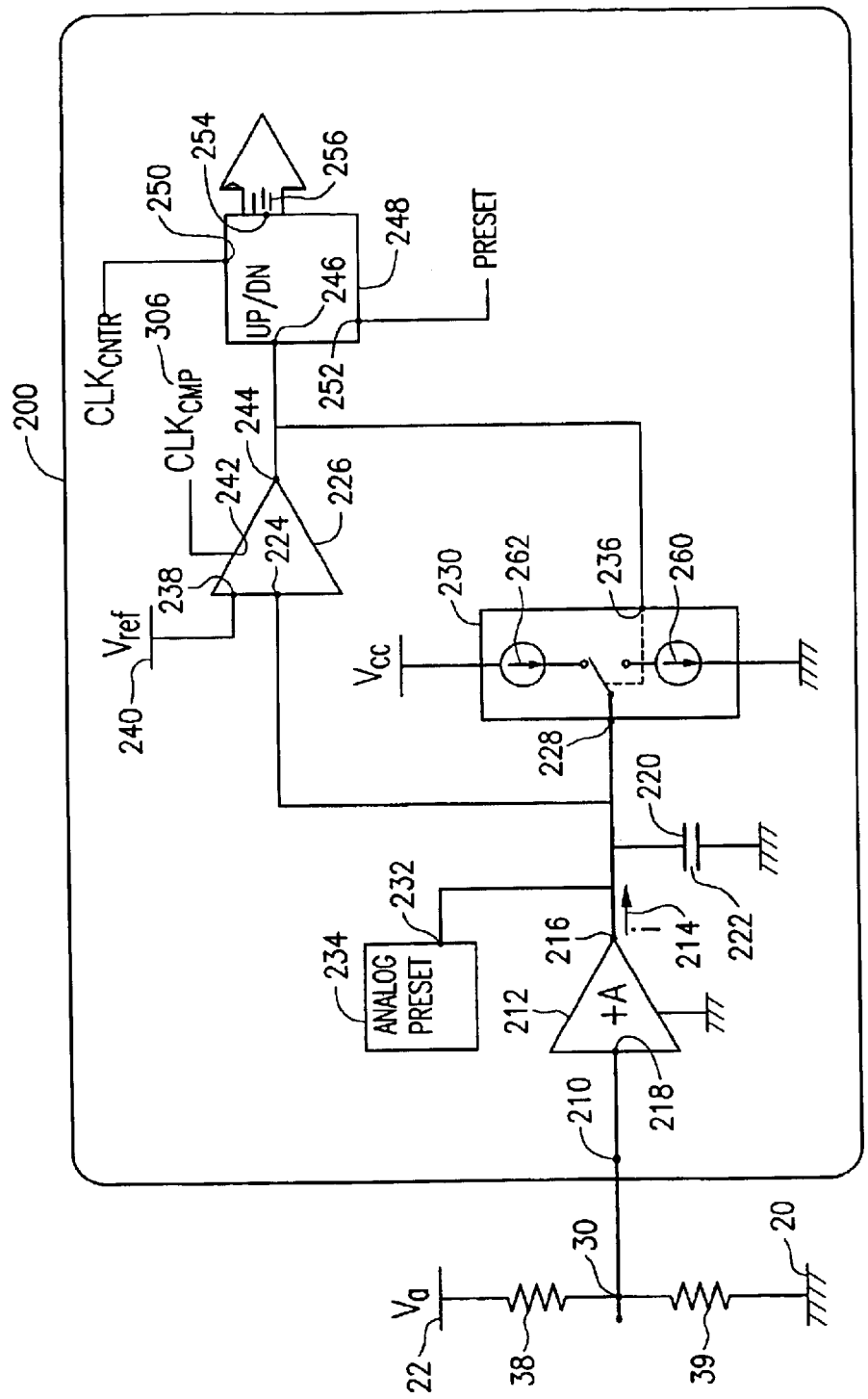
FIG. 6 shows a sensing circuit of the present invention in block diagram form.

FIG. 6 illustrates an embodiment of the invention in which a sensing circuit 200 has an input node 210 connected to a column line 30 of a resistive memory device. The sensing circuit includes a transconductance amplifier 212. The transconductance amplifier has a transfer function such that a current 214 output at an output node 216 of the amplifier is related to a voltage applied at an input node 218 of the amplifier. The output node 216 of the amplifier is connected to a first plate 220 of a capacitor 222, to a first input 224 of a clocked comparator 226, to an input 228 of a current source circuit 230, and (optionally) to an output 232 of an analog preset circuit 234. It should be noted that the function of the analog preset circuit may be performed by a properly configured transconductance amplifier 212 making a separate analog preset circuit unnecessary. The current source circuit 230 is adapted to alternately supply or withdraw a current from the first capacitor plate 220 according to the state of a control signal applied at a control input 236 of the current source 230. The clocked comparator 226 includes a second input 238 adapted to be maintained at a reference voltage $V_{ref}$ 312 (FIG. 7A) by a reference voltage source 240, a clock input 242 adapted to receive a clock signal, and an output 244. The output 244 of the comparator 226 is coupled to an up/down input 246 of a clocked counter 248 and to the control input 236 of the current supply circuit 230. The clocked counter 248 includes a clock input 250 a preset input 252 and a digital count output 254 including a plurality of digital output lines 256.

In operation, a preset voltage 311 (FIG. 7A) is established across the capacitor 222 by the analog preset circuit 234. A digital preset value is established at the output 254 of the counter 248 by a signal transition applied at the digital preset input 252.

Assuming that the preset voltage 311 on the capacitor 222 is less than the reference voltage $V_{ref}$ 312 applied at the second input 238 of the comparator 226 the output 244 of the comparator 226 will apply a first value corresponding to an "up" input at the input 246 of the digital counter 248 as soon as the clock input 242 of the comparator 226 receives a clock signal transition. The first value output by the comparator is also applied to the control input 236 of the current source circuit 230. Accordingly, current 262 flows from the input 228 of current source circuit 230 so as to raise the voltage on the capacitor 222 above its preset voltage 311.

FIG. 7A shows the resulting voltage signal 302 on the capacitor 222 when no voltage is applied at input 218 of amplifier 212.

The voltage 302 on the capacitor 222 rises above the voltage threshold defined by the reference voltage 312 applied at input 238 of comparator 226. Thereafter, the voltage on capacitor 222 continues to rise until a clock transition of clock signal 306 (FIG. 7C) is detected at the clock input 242 of the comparator 226. Upon detection of a clock transition, the logical state of the output 244 of comparator 226 toggles (e.g., from "up" to "down"). Responsively, the current source circuit 230 changes state to begin extracting current 260 from the capacitor 222. As current 260 flows out of the capacitor, the voltage on the capacitor falls to, and then below the reference voltage $V_{ref}$ level. Thereafter, when the clock signal 306 at input 242 of comparator 226 transitions, the comparator output toggles again.

The resulting voltage 302 on the capacitor 222 oscillates with a symmetrical triangular waveform.

FIG. 7B shows the counter clock signal 304 applied at the clock input 250 of the counter 248.

FIG. 7C shows the comparator clock signal as 306 applied at the clock input 242 of the clock comparator 226.

FIG. 7D shows an output count value 308 exhibited at the output 254 of the counter 248. Note that the output count 308 begins at a digital preset value 310.

The counter cyclically counts away from the preset value and back to it. Consequently, the counter counts up and down alternately, and the time average value of the digital counter count remains substantially constant (near the digital preset value). Stochastic noise at the input of the comparator may cause the counter to increment the count when it should not. Over time, however, random noise will tend to cause the counter to execute as many spurious decrements as spurious increments. The noise will be self-canceling. The counter therefore acts to filter out high frequency noise in the system.

Figures 8A, 8B, 8C:
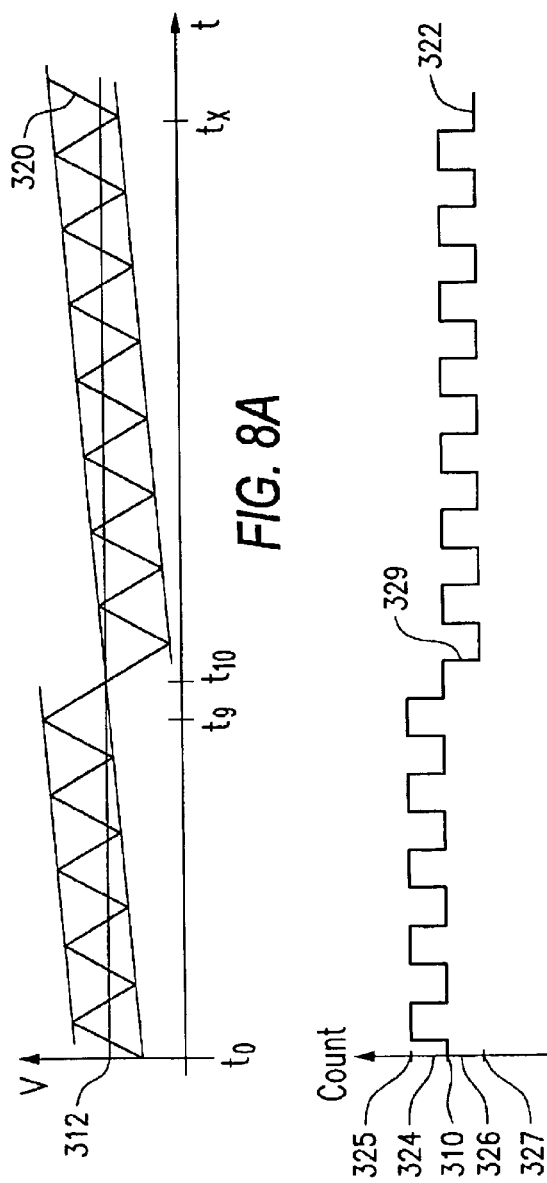
FIGS. 8A–8C shows a timing diagram for an idealized voltage signal of the FIG. 6 circuit with a first non-null input and related values.

When the input voltage signal applied to the input 218 of the amplifier 212 is non-zero, a corresponding non-zero current 214 is applied to the first plate 220 of the capacitor 222. FIG. 8A shows the resulting voltage waveform on the first plate 222 of the capacitor 220 when a first voltage is applied to the input 218 of the amplifier 212.

The current 214 from the amplifier 212 adds with the currents 260, 262 from the current source circuit. When, for example, the sense of the current 214 out of the amplifier 212 tends to charge the capacitor 222, the capacitor 222 charges slightly more quickly and discharges slightly more slowly than is the case for the signal 302 of FIG. 7A. Consequently, in the time between transitions of the comparator clock signal 306, the voltage on the capacitor 222 tends to rise slightly more than it falls during the immediately following inter-transition time. As a result, the average voltage on the capacitor tends to rise over time until the capacitor has accumulated excess charge to a point where the discharge of the capacitor that occurs during one clock interval is insufficient to bring the voltage on the capacitor below the reference voltage $V_{ref}$ 312. Consequently, the voltage 320 on the capacitor 222 is above the reference voltage 312 for two consecutive transitions $t_9$, $t_{10}$ (as shown in FIG. 8C) of the clock signal 306 applied at the clock input 242 of the clocked comparator 226. This is reflected in the digital count at the next subsequent transition of the clock signal applied to the input 250 of the counter 248. As shown, the time average value of the counter output changes from a first value 324 to a second value 326.

Because of the inflow of current 214 from the amplifier 212 into the capacitor 222 this situation will repeat periodically, and the time averaged count on the digital counter will decrease at a rate corresponding to the magnitude of the voltage applied at the input 218 of the amplifier 212.

FIG. 8B graphically illustrates the value output by the digital counter 248 corresponding to the voltage signal of FIG. 8A. The vertical axis shows a digital value as exhibited at the output 254 of the clocked counter 248. The horizontal axis shows time.

The graph of FIG. 8B thus shows, at time $t_0$, a count value 310 equal to the "digital preset value". Thereafter, the count value counts up one unit to ("digital preset value" +1) 325 and back down to the digital preset value 310. This occurs repeatedly until, at time $t_{10}$, the count drops 329 one additional unit from the digital preset value 310 to ("digital preset value" −1) 327. For some time thereafter, as shown, the count output varies with time between ("digital preset value" −1) 327 and "digital preset value" 310.

Figure 9A:
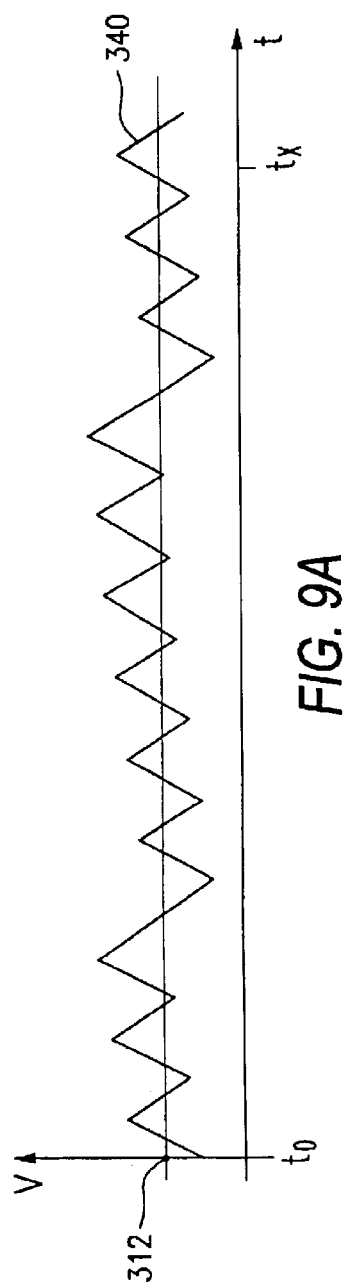
FIGS. 9A–9B shows a timing diagram for an idealized voltage signal of the FIG. 6 circuit with a second different non-null input and related values.
Figure 9B:
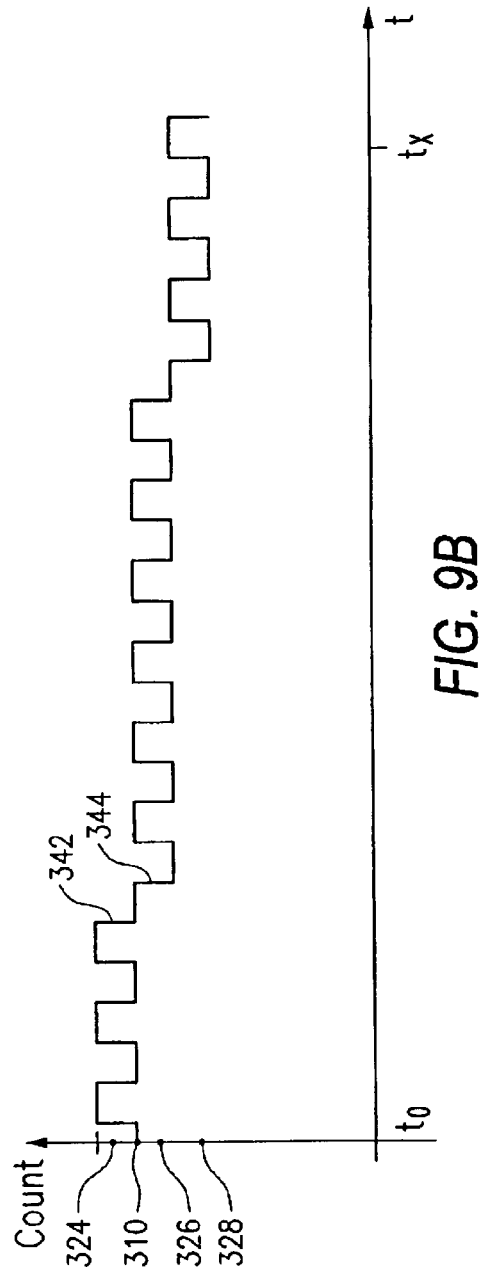

FIG. 9A shows the resulting voltage signal 340 on the capacitor 222 when a different (e.g. larger) voltage is applied to the input 218 of the amplifier 212. As in the FIG. 6A case, the average voltage on the capacitor rises over time. Because the current 214 supplied by the amplifier 212 is larger than in the FIG. 8A case, however, the rate of this rise in mean capacitor voltage is faster that in FIG. 8A. Consequently, as seen in FIG. 9B, two consecutive down-counts 342, 344 occur more frequently than is the case in FIG. 6A. The result is that the digital counter 248 will decrement from the digital preset value 310 more rapidly as a higher voltage is applied to the input 218 of the amplifier 212.

FIG. 9B graphically illustrates the count value output by the digital counter 248 corresponding to the voltage signal of FIG. 9A.

FIG. 10A reproduces the graph of FIG. 8A, except that a noise component is added to the voltage signal 320 on capacitor 220. As is apparent, such noise may cause the digital count to transition slightly before (FIG. 10C) or after (FIG. 10D), the transition time $t_t$ of a noiseless system (FIG. 10B). Such early or late transition, however, has no substantial effect on the ultimate count detected after a relatively long sampling duration.

Figure 11:
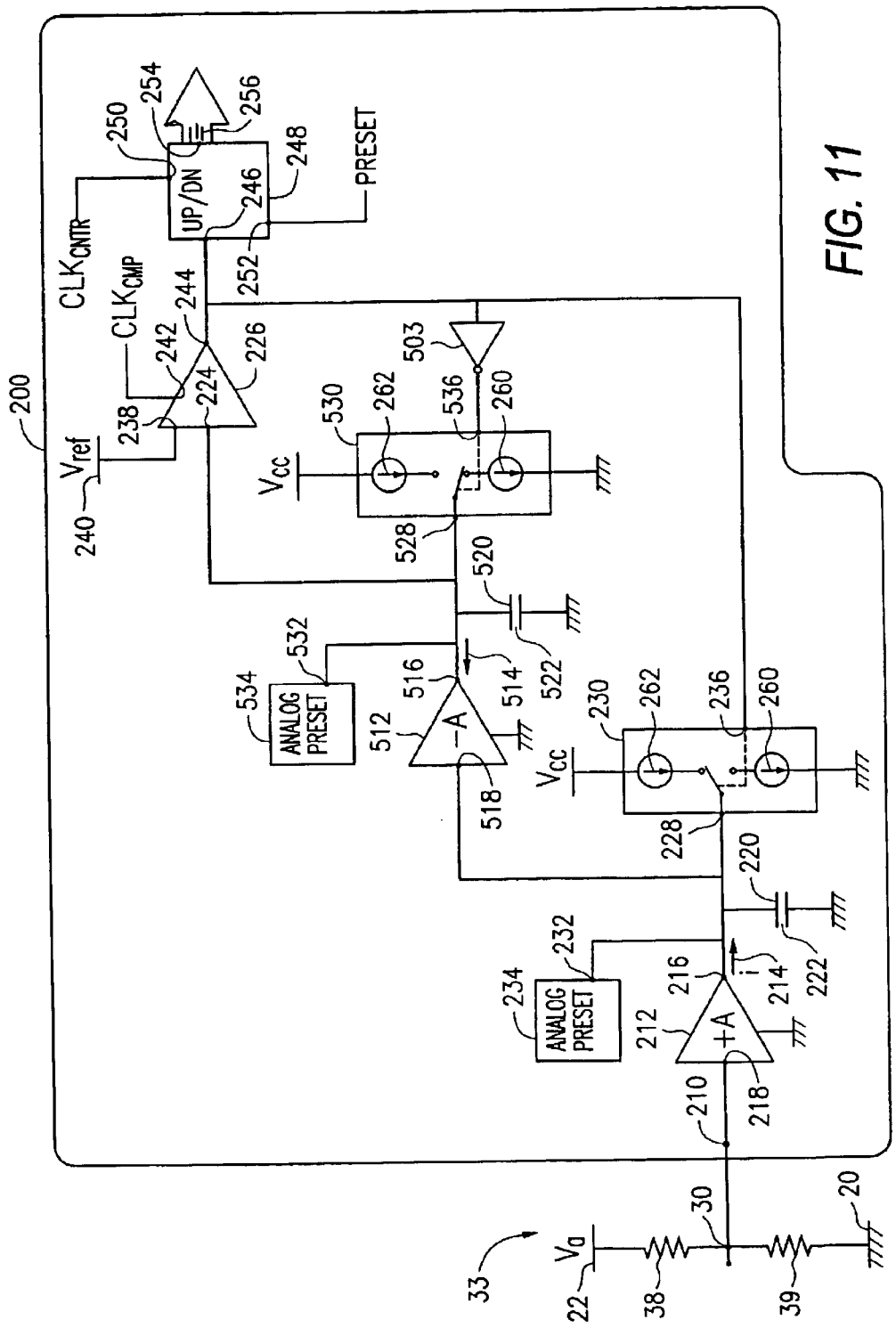
FIG. 11 shows a further embodiment of a sensing circuit of the present invention.

FIG. 11 shows a further aspect of the invention in which a second amplifier stage is employed to further increase signal sensitivity. As in FIG. 6, the voltage divider 33 includes column line 30 mutually coupled to a first end of the sensed memory cell 38, and a first end of the sneak path resistance 39. An input node 210 of the sensing circuit is also coupled to the column line 30. A second end of the sneak path resistance 39 is coupled to ground potential 20, and a second end of the sensed memory cell 38 is coupled to a source of array voltage (Va) 22.

As in the FIG. 6 circuit, the FIG. 11 circuit includes a transconductance amplifier 212 with an input 218 coupled at input node 210 to the column line 30, and an output 216 coupled to the first plate 220 of a first capacitor 222. Instead of being directly coupled to an input of the clocked comparator 226, however, the capacitor plate 220 is coupled to an input 518 of a further transconductance amplifier 512.

An output 516 of the further transconductance amplifier 512 is coupled to a second plate 520 of a second capacitor 522, and to the input 224 of the clocked comparator 226. The output 224 of the clocked comparator 226 is coupled to the input 246 of the counter 248, and the input 528 of a second current supply circuit 530. The output 224 of the clocked comparator 226 is also coupled through an inverter 503 to an input 536 of the second current source circuit 530.

The current source circuit 530 thus acts in counterphase to the current source circuit 230, such that circuit 530 withdraws current 260 from capacitor plate 520 at the same time that current source 230 is supplying current 262 to capacitor plate 220 (and vice versa).

In an alternative embodiment, a single current source circuit may be used to supply both capacitors 222 and 522 with respective currents. Also, a further analog preset circuit 534 is shown coupled at an output 532 to capacitor plate 520. One of skill in the art would readily derive from the foregoing disclosure a circuit in which a single analog preset circuit is used to establish a preset voltage on both capacitors 222 and 522. Alternately, one may, as discussed above, effect a desired analog preset using the amplifier circuits 212, 512, such that no separate analog preset circuit is required.

In one aspect of the invention, the amplifier 212 exhibits positive gain, while the amplifier 512 exhibits negative gain. Thus, as the voltage applied at input 518 increases, the current 514 flowing out of input 516 decreases (or increase in a negative sense). Hence, in operation, the circuit of FIG. 11 tends to count up, rather than down, from a digital preset value. An example of this behavior is shown in FIGS. 12A and 12B.

Figure 12A:
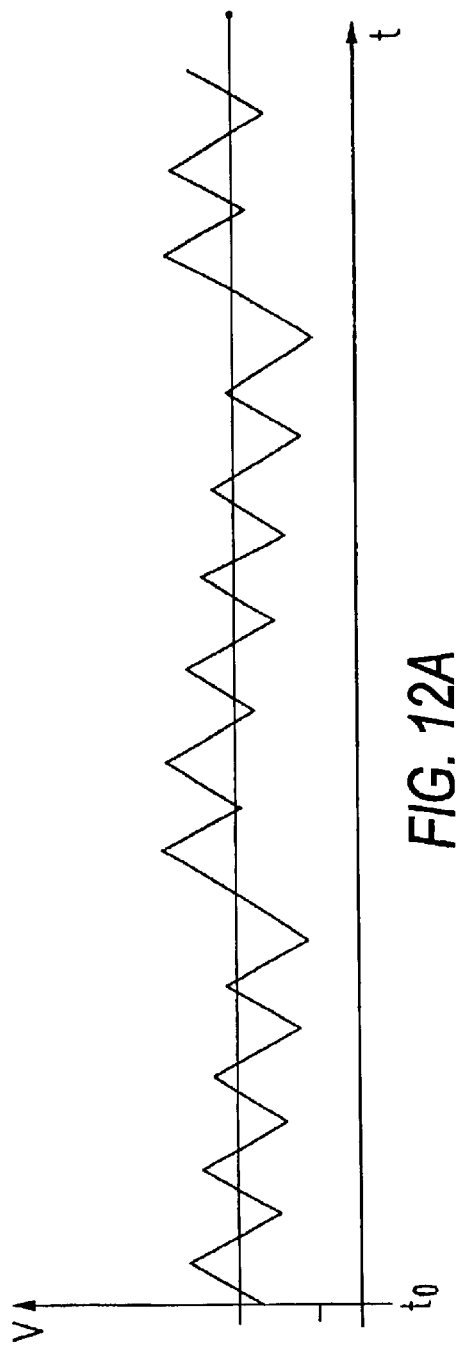
FIGS. 12A–12B shows a timing diagram as in FIGS. 9A–9B according to the circuit of FIG. 11.

FIG. 12A shows the voltage on a capacitor 522 over time. The actual voltage graph would be composed of second order curves, rather than line segments. The graph shown has been approximated with line segments for ease of representation.

Figure 12B:
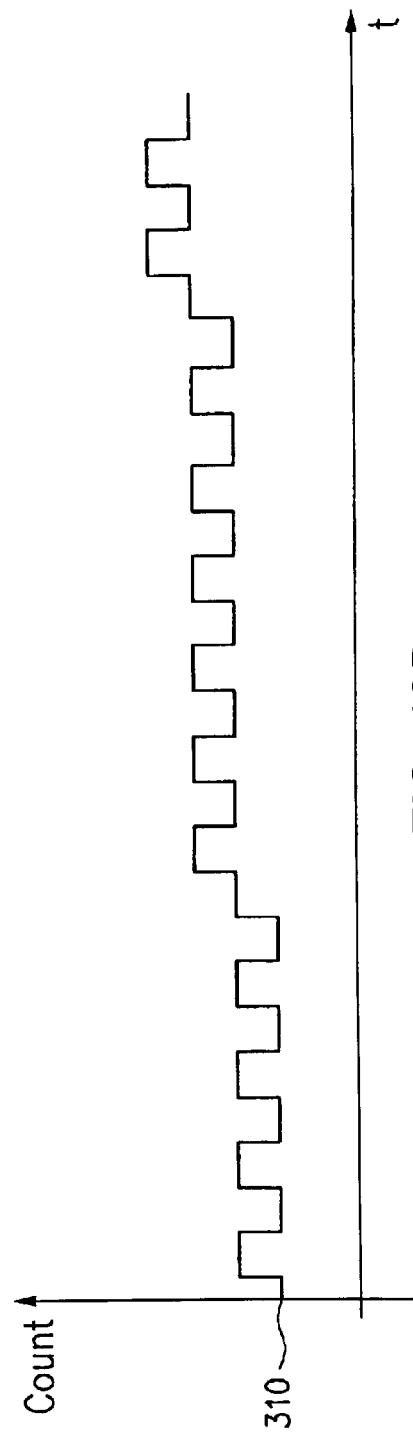

FIG. 12B shows how the digital counter 248 increments with time from a digital preset value 310 in relation to the operation of the circuit of FIG. 11.

It should be noted that the time-average value of the net current supplied by current supply 230 of the FIG. 6 circuit is equal to the time average value of current 214, taken over the same period. Further, the time average value of the counter output may be made to trend upwardly or downwardly depending on routine selection of circuit parameters. It should also be noted that in one aspect the input node 210 of sensing circuit 200 may desirably be coupled to the column line 30 in series through a capacitor so as to filter out a DC component of input voltage.

In a typical embodiment, hundreds, or even thousands, of cycles of clock signal 306 are applied to clock input 242 during a single resistance measurement event. For example, a minimum of 500 clock cycles will yield a resolution of 0.2 nanoamperes with respect to current 214. As would be understood by one of skill in the art, the selection of clock frequencies, and the relationship between clock frequencies is a matter of routine design. For example, there is no requirement that the comparator clock and the counter clock operate at the same frequency, although they may do so.

Figure 13:
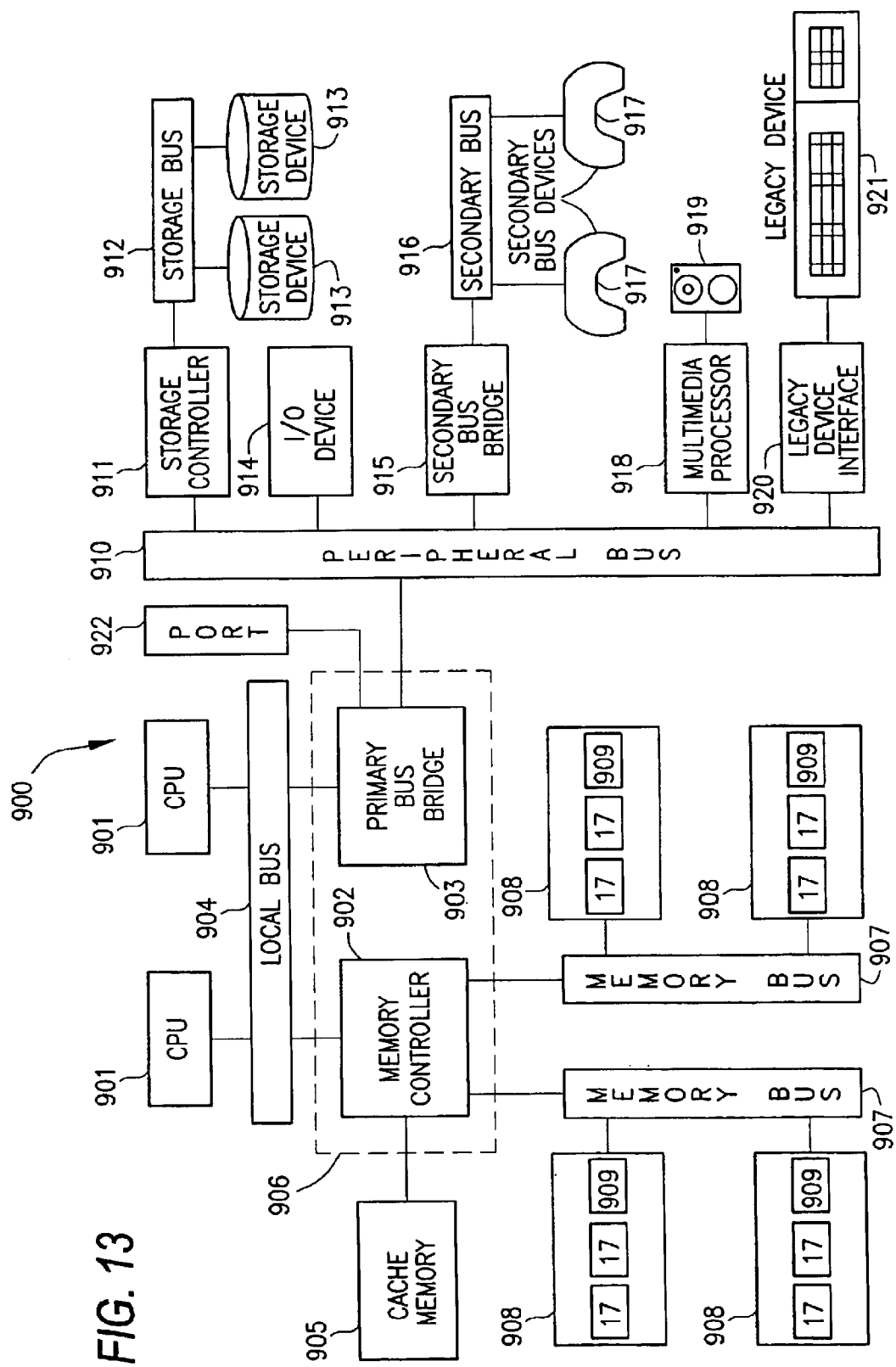
FIG. 13 shows an exemplary digital system incorporating a memory device having a sensing circuit according to one aspect of the present invention.

FIG. 13 illustrates an exemplary processing system 900 which utilizes a memory device 17 employing the cell resistance sensing circuit 200 of the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908, which include at least one memory device 17 contain the all resistive sensing system of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 13 is only an exemplary processing system with which the invention may be used. While FIG. 13 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While preferred embodiments of the invention have been described in the illustrations above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed is:

1. A method of sensing a logical state of a memory cell comprising:

presetting a count value of a counter to a preset count value;

charging a capacitor with a charging current during a first plurality of time intervals, each time interval of said first plurality terminated when a periodic test of said capacitor indicates that a first voltage thereon exceeds a threshold voltage;

discharging said capacitor with a discharging current during a second plurality of time intervals, each time interval of said second plurality terminated when a periodic test of said capacitor indicates that a second voltage thereon is below said threshold voltage;

supplementing said charging and discharging currents with a further current, said further current extending a duration of one or more time intervals of said second plurality of time intervals to form a third plurality of extended time intervals, said further current related to a resistance value of a resistive element of a memory cell, said resistance value corresponding to a logical state of said memory cell;

periodically incrementing said counter during said first plurality of time intervals and periodically decrementing said counter during both said second and third of pluralities of time intervals so as to effect a net change in said count value over time; and relating said net change in said count value over time to said logical state of said memory cell.

2. A method of sensing a state of a memory cell as defined in claim 1 wherein said further current comprises a charging current.

3. A method of sensing a state of a memory cell as defined in claim 1 wherein said periodically incrementing said counter comprises:

incrementing said counter once during each time interval of said first plurality of time intervals.

4. A method of sensing a state of a memory cell as defined in claim 1 wherein said periodically decrementing said counter comprises:

decrementing said counter one or more times during each time interval of said second and third pluralities of time intervals.

5. A method of sensing a state of a memory cell as defined in claim 1 wherein the said supplementing said charging and discharging current with a further current comprises:

receiving a further voltage related to said resistance value of said resistive element at an input of a transconductance amplifier; and outputting said further current at an output of said transconductance amplifier, said transconductance amplifier having a transfer function such that said further current is functionally related to said further voltage.

6. A method of sensing a state of a memory cell as defined in claim 5 further comprising:

configuring said resistive element of said memory cell in a voltage divider circuit, said voltage divider circuit having a common node; and applying a standard voltage across said voltage divider circuit such that said common node exhibits said further voltage related to said resistance value of said memory cell.

7. A method of sensing a state of a memory cell as defined in claim 1 wherein said memory cell comprises an MRAM memory cell.

8. A method of sensing a state of a memory cell as defined in claim 1 wherein said supplementing said charging and discharging currents with a further current comprises flowing said further current onto a common plate of said capacitor with said charging and discharging currents respectively.

9. A method of sensing a state of a memory cell as defined in claim 1 wherein said periodically incrementing said counter during said first plurality of time intervals comprises incrementing said counter one count increment during each of said first plurality of time intervals.

10. A method of sensing a state of a memory cell as defined in claim 1 wherein said periodically decrementing said counter during said second plurality of time intervals comprises decrementing said counter one count increment during each of said second plurality of time intervals and decrementing said counter two count increments during each of said third plurality of time intervals.

11. A method of sensing a state of a memory cell as defined in claim 1 further comprising:

filtering a noise component out of said further current.

12. A method of sensing a state of the memory cell as defined in claim 1 wherein said first and second pluralities of time intervals are interleaved such that each time interval of said first plurality of rime intervals is followed immediately by a respective one time interval of said second plurality of time intervals, and each time interval of said second plurality of time intervals is followed immediately by a respective one time interval of said first plurality of time intervals.

13. A method of sensing a logic value of a resistive memory cell, said method comprising:

applying a voltage to said cell during a measurement period and producing a resulting current flow output of an amplifier during said measurement period;

using said resulting current flow in combination with an auxiliary current flow to repeatedly charge and discharge a capacitor during said measurement period, said auxiliary current flow controlled in relation to an instantaneous voltage value on said capacitor;

up and down counting a counter value in response to said instantaneous voltage on said capacitor being above or below a threshold voltage at a plurality of sampling times during said measurement period; and determining a resistance value of said memory cell based on said counter value at the end of said measurement period.

14. A method of sensing a logic state of an MRAM cell comprising:
- applying a first voltage across said cell;
- producing a current representing said first voltage;
- integrating said current upwardly past a reference voltage over a first duration to produce a first integrated voltage signal;
- integrating said current downwardly past said reference voltage over a second duration to produce a second integrated voltage signal;
- accumulating a count by incrementing a counter during said first duration and decrementing said counter during said second duration;
- repeating said integrating and accumulating operations over a predetermined time period; and
- relating a value of said counter after said predetermined time period to a logic state of said MRAM cell.

15. A method of sensing a logic state of an MRAM cell comprising:
- a) applying a first voltage across said cell;
- b) amplifying said first voltage to produce a first current corresponding to said first voltage;
- c) integrating said first current on a capacitor with a second current upwardly over a first duration to produce a second upward voltage change on said capacitor;
- d) integrating said first current on said capacitor with a third current downwardly over a second duration to produce a third downward voltage change on said capacitor;
- e) repeating steps a–d over time;
- f) accumulating a fourth voltage on said capacitor by storing a difference between said second upward voltage change and said third downward voltage change over time until said fourth voltage exceeds a fifth reference voltage;
- g) discharging said capacitor and adjusting a count of a digital counter; and
- h) repeating steps a–g over time; and
- i) relating a value of said count at a measuring time to said logic state of said MRAM cell.

16. A method as defined in claim 15 comprising:
- presetting a count value of said digital counter to an initial value.

17. A method as defined in claim 15 wherein said second current comprises:
- a positive current produced by a current source during said first duration.

18. A method as defined in claim 15 wherein said third current comprises:
- a negative current produced by a current source during said second duration.

19. A sensing circuit for sensing a resistive state of an MRAM memory cell comprising:
- a first node and a second node;
- a transconductance amplifier having a first input coupled to one end of a resistive element of said MRAM memory cell and a first output coupled to said first node;
- a capacitor having a first plate coupled to said first node and a second plate coupled to a first source of constant potential;
- a current source having a second output coupled to said first node, said current source adapted to alternately source or sink a current to said first node through said second output terminal, said current source having a control terminal coupled to said second node adapted to receive a control signal for controlling whether said current source is sourcing or sinking current at a particular time;
- a comparator circuit having a second input coupled to said first node, a third input coupled to a source of a reference potential, and a fourth input coupled to a source of a first clock signal, said comparator circuit having a third output coupled to said second node; and
- a counter circuit having a fifth input coupled to said first node, a sixth input coupled to a source of a second clock signal, a seventh input coupled to a source of a preset signal, and a fourth output adapted to output a digital count value.

20. A sensing circuit for sensing a resistive state of an MRAM memory cell as defined in claim 19 further comprising an analog preset circuit having a fifth output coupled to said first node for establishing a preset voltage across said capacitor.

21. A sensing circuit for sensing a resistive state of an MRAM memory cell as defined in claim 19 wherein said current sourced by said current source and said current sunk by said current source are of substantially equal magnitude.

22. A sensing circuit for sensing a resistive state of an MRAM memory cell as defined in claim 19 wherein said first and second clock signals are out of phase with one another.

23. A sensing circuit for sensing a resistive state of an MRAM memory cell as defined in claim 19 wherein said first and second clock signals have different frequencies.

24. A sensing circuit for sensing a resistive state of an MRAM memory cell as defined in claim 19 wherein said seventh input of said counter circuit is adapted to receive a preset signal transition, whereupon said fourth output of said counter circuit assumes a particular count value.

25. A sensing circuit for sensing a resistive state of an MRAM memory cell as defined in claim 19 wherein said transconductance amplifier is adapted to produce an output current at said first output, said output current being functionally related to an input voltage applied at said first input.

26. A memory cell sensor comprising:
- a capacitor adapted to be charged by a first current from a first current source during a first time interval and to be discharged by a second current from a second current source during a second time interval, said first and second currents having substantially equal magnitude and opposite direction with respect to said capacitor;
- a transconductance amplifier adapted to output a third current to said capacitor during said first and second time intervals, said third current adding to said first current, said third current subtracting from said second current, said third current having a magnitude related to a first voltage signal received at a first input of said transconductance amplifier, said first time interval and said second time interval respectively related in duration to said magnitude of said third current;
- a resistance network adapted to apply said first voltage across a resistive memory cell, said first voltage being related to a resistance of said resistive memory cell; and
- a counter adapted to increment a count output thereof in relation to a differential duration between said first and second time intervals.

27. A memory cell sensor as defined in claim 26 wherein said resistance of said resistive memory cell represents a logical state of said resistive memory cell.

28. A digital processing system comprising:

a central processing unit coupled to a memory module, said memory module including an MRAM device having a sensing circuit including:

a first node and a second node;

a transconductance amplifier having a first input coupled to one end of a resistive element of said MRAM memory cell and a first output coupled to said first node;

a capacitor having a first plate coupled to said first node and a second plate coupled to a first source of constant potential;

a current source having a second output coupled to said first node, said current source adapted to alternately source or sink a current to said first node through said second output terminal, said current source having a control terminal coupled to said second node adapted to receive a control signal for controlling whether said current source is sourcing or sinking current at a particular time;

a comparator circuit having a second input coupled to said first node, a third input coupled to a source of a reference potential, and a fourth input coupled to a source of a first clock signal, said comparator circuit having a third output coupled to said second node; and a counter circuit having a fifth input coupled to said first node, a sixth input coupled to a source of a second clock signal, a seventh input coupled to a source of a preset signal, and a fourth output adapted to output a digital count value.

* * * * *

UNITED STATES PATENT AND TRADEMARK OFFICE
CERTIFICATE OF CORRECTION

PATENT NO. : 6,914,838 B2  
DATED : July 5, 2005  
INVENTOR(S) : R. J. Baker

It is certified that error appears in the above-identified patent and that said Letters Patent is hereby corrected as shown below:

Column 2,  
Line 24, "an memory" should read -- a memory --;

Column 7,  
Line 29, "(or increase" should read -- (or increases --;

Column 8,  
Lines 33-34, "an miscellaneous" should read -- a miscellaneous --;  
Line 35, "an legacy" should read -- a legacy --;  
Line 36, "may also coupled" should read -- may also be coupled; --;  
Line 46, "an local" should read -- a local --;  
Line 50, "an universal" should read -- a universal --;  
Line 51, "917 via to the" should read -- 917 via the --;  
Line 54, "to one additional" should read -- to additional --;

Column 9,  
Line 5, "system" should read -- systems --;

Column 10,  
Line 45, "rime" should read -- time --.

Signed and Sealed this

Second Day of May, 2006

JON W. DUDAS  
*Director of the United States Patent and Trademark Office*